United States Patent [19]

Lehrer

[11] 4,420,365

[45] Dec. 13, 1983

[54] FORMATION OF PATTERNED FILM OVER SEMICONDUCTOR STRUCTURE

[75] Inventor: William I. Lehrer, Los Altos, Calif.

[73] Assignee: Fairchild Camera and Instrument Corporation, Mountain View, Calif.

[21] Appl. No.: 474,866

[22] Filed: Mar. 14, 1983

[51] Int. Cl.$^3$ .................... B44C 1/22; C03C 15/00; C03C 25/06

[52] U.S. Cl. .................... 156/643; 156/657; 156/659.1; 204/192 E; 427/259; 427/282; 427/305; 430/317

[58] Field of Search ............ 156/643, 653, 657, 659.1, 156/644, 646; 427/43.1, 96, 98, 259, 282, 304, 305; 252/79.1; 430/317, 313, 315; 204/192 E

[56] References Cited

U.S. PATENT DOCUMENTS

| | | | |
|---|---|---|---|
| 3,794,536 | 2/1974 | Muska | 156/643 X |
| 4,335,506 | 6/1982 | Chiu et al. | 156/659.1 X |
| 4,352,716 | 10/1982 | Schaible et al. | 156/643 |
| 4,375,390 | 3/1983 | Anderson et al. | 156/643 |

Primary Examiner—William A. Powell
Attorney, Agent, or Firm—Kenneth Olsen; Robert C. Colwell; Carl L. Silverman

[57] ABSTRACT

A novel process is disclosed for the selective etching of a protective layer over a substrate according to a predetermined pattern, which does not involve the use of chemical vapor deposition or vacuum techniques. The process incorporates the techniques of electroless metal deposition after first applying a mask which is positive with respect to the predetermined pattern. In alternative embodiments, the application to the masked protective layer of an agent catalytic to the reception of electroless metal deposition is followed by either immersion in an electroless plating bath and subsequent mask removal, or by mask removal and subsequent immersion in the electroless plating bath. In either embodiment, the protective layer is effectively masked and patterned for plasma etching. The process is useful in forming openings in the protective layer to permit selective doping of the underlying substrate.

10 Claims, 6 Drawing Figures

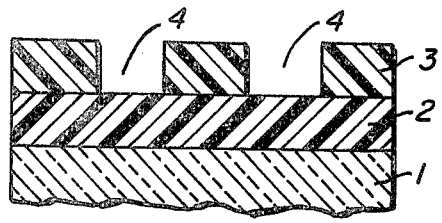
FIG._1.
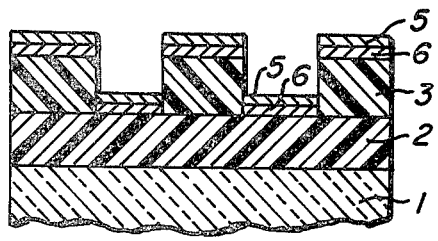
FIG._2.
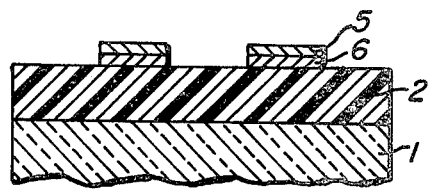
FIG._3A.
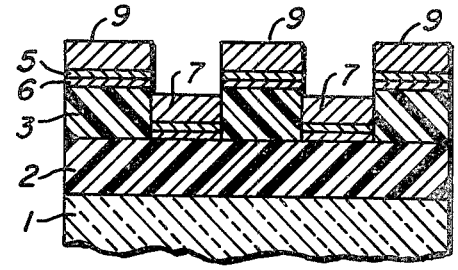
FIG._3B.
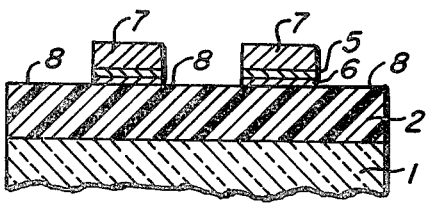
FIG._4.
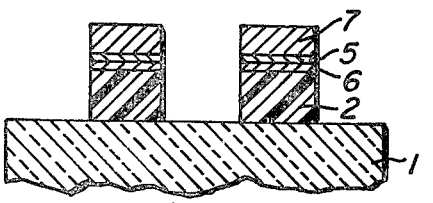
FIG._5.

FORMATION OF PATTERNED FILM OVER SEMICONDUCTOR STRUCTURE

BACKGROUND OF THE INVENTION

1. Field of the Invention

This invention relates to integrated circuits and methods for their fabrication. In particular, this invention relates to a method for forming an effective plasma barrier for patterning a protective insulating layer over a semiconductor structure.

2. Description of the Prior Art

In the fabrication of integrated circuits, P and N conductivity type dopants are sequentially introduced into regions of semiconductor material to form active and passive electronic components. This is generally achieved by forming one or more layers of desired material over the semiconductor, and patterning each layer by etching through a mask to expose portions of the underlying layer. The appropriate dopant is then introduced by diffusion or ion implantation after each etching step.

Present techniques for forming the mask generally involve depositing a masking material, usually silicon dioxide, over the insulating layer by chemical vapor deposition or vacuum methods. Photolithographic exposure and etching must then by done to pattern the mask. These techniques are cumbersome and expensive.

SUMMARY OF THE INVENTION

A novel technique is provided for selectively removing portions of an etchable layer on a substrate according to a predetermined pattern, which incorporates electroless metal deposition techniques, and avoids the need for chemical vapor deposition or vacuum methods. This invention permits the direct patterning of an effective plasma barrier, avoiding several of the steps required in the prior art technique and substantially simplifying the masking process.

BRIEF DESCRIPTION OF THE DRAWINGS

FIG. 1 is a cross-sectional view of a semiconductor structure containing an etchable layer over which a mask has been applied.

FIG. 2 is a cross-sectional view of the structure of FIG. 1 after having been prepared for electroless metal deposition.

FIG. 3A and FIG. 3B are cross-sectional views of alternative subsequent stages of the process of the invention; FIG. 3A representing the structure of FIG. 2 after mask removal and prior to electroless metal deposition, and FIG. 3B representing the structure of FIG. 2 after electroless metal deposition but prior to mask removal.

FIG. 4 is a cross-sectional view of the structure of FIG. 2 after both electroless deposition and mask removal, the latter two steps having been done in either sequence.

FIG. 5 is a cross-sectional view of the structure of FIG. 4 after plasma etching.

DESCRIPTION OF THE PREFERRED EMBODIMENTS

FIG. 1 is a cross-sectional view of a semiconductor structure which includes a substrate 1, an overlying etchable layer 2 and a mask 3. As shown, the mask is patterned in a positive manner with respect to the pattern by which the etchable layer is ultimately desired to be etched.

The substrate 1 is any base material over which a patterned layer of etchable material is desired. In preferred applications, the substrate is a wafer or panel of semiconductor material in which isolated islands of selectively doped material are ultimately to be formed. Silicon is the most common such material.

The etchable layer 2 is a layer overlying and adhesively bound to the substrate, and is formulated from any material which can be etched independently of the substrate. In the manufacture of semiconductor structures, layer 2 is preferably a layer of protective insulating material which is an effective barrier against dopants, thereby enabling the doping of selected regions in the substrate through openings formed when this material has been patterned. Suitable insulating materials are well known in the art. Examples include glass compounds such as spin-on glasses, chemical-vapor-deposited glasses, and vacuum deposited glasses; polyimides; thermally grown silicon dioxide; and silicon nitride.

The mask 3 is any resist-type material which can be conveniently removed by conventional techniques. Examples include organic polymeric masking materials well known in the art, such as novolac-type phenol-formaldehyde resins containing photosensitive cross-linking agents. Examples of such materials are AZ-type photoresist materials available from Shipley Co., Inc., Newton, Massachusetts.

Other examples include KODAK MICRORESIST 747 available from Eastman Kodak Co., Rochester, New York, and WAYCOAT HPR positive resists available from Philip A. Hunt Chemical Corporation, Palisades Park, New Jersey.

According to the usual techniques for applying masks, the underlying surface is first cleaned to render it hydrophilic and to improve adhesion, wetting, absorption and adsorption characteristics, etc. Suitable chemical cleaning solutions are well known in the art. The optimum solution for any particular application will depend upon the contaminants present. Generally, however, any strong mineral acid followed by a de-ionized water rinse will suffice. Typical examples include a 10% aqueous solution of sulfuric acid and a 50% aqueous solution of nitric acid.

After the layer of masking material 3 is applied, it is patterned by conventional lithographic techniques, generally involving exposing and developing the photoresist layer. The patterning process produces openings 4 over the areas where it is desired to etch the insulating layer 2.

FIG. 2 shows the structure of FIG. 1 after it has been prepared for electroless metal deposition. Preparation generally involves the application of an agent catalytic to the reception of metal in reduced form. Such agents are generally precious metals, and the application thereof is generally referred to as "activating" the surface. Suitable precious metals include palladium, platinum, gold, silver, iridium, osmium, ruthenium and rhodium. Palladium, platinum and rhodium are preferred, with palladium being the most commonly used. The precious metal is applied as a metallic layer 5, and is usually preceded by a surface treatment called "sensitizing," which refers to the application of a layer of sensitizing agent 6 to render the surface receptive to the precious metal. The sensitizing agent is a reducing agent which permits reduction of the precious metal to metallic form for deposition on the surface. Typical among reducing agents are the chlorides and bromides of tin, titanium and lead, the metals being in their lower oxidation state, notably $SnCl_2$, $TiCl_3$, $PbCl_2$, etc. The precious metal is then applied in the form of a salt from which the metal will precipitate in reduced form. Typical such salts are the halides, particularly the chlorides, bromides and iodides. Chlorides are preferred for convenience and economy. Examples are $PdCl_2$, $PtCl_2$, and $RhCl_3$.

FIGS. 3A and 3B show alternate routes to FIG. 4, the latter being a cross-sectional representation of the semiconductor structure with a layer of metal deposited by electroless techniques over the areas previously left open by the mask 3 and where the previously masked areas 8 of the insulating layer are exposed for subsequent plasma etching.

In the first alternative, i.e., the route indicated by FIG. 3A, the desired structure is achieved by first removing the mask to provide the intermediate stage shown in FIG. 3A and then forming the metallic layer 7 over the remaining areas by electroless deposition. The second alternative, i.e., the route indicated by FIG. 3B, is a lift-off process whereby electroless deposition is performed first, followed by removal of the mask.

Mask removal in either case is readily accomplished by known techniques, notably the use of organic solvents, for example, acetone or an acetone/alcohol mixture. Removal of the mask 3 will also cause removal of the overlying layers. In the first alternative, this will leave only those areas which were initially not covered by the mask susceptible to electroless deposition. In the second alternative, mask removal will also remove the electrolessly deposited metal film deposited on mask 3.

Electroless deposition in either alternative is readily achieved by standard techniques well known in the art. Any metal capable of being deposited by electroless deposition can be used, such as, for example, copper, nickel, gold, or palladium. The optimum metal for any given application will depend on its ease of removal during the subsequent processing steps which, as indicated below, may vary. For most applications, copper is preferred.

A typical deposition technique involves immersing the substrate in an electroless plating bath under predetermined conditions of pH and temperature and for a specified duration, all adjusted to achieve a layer of the desired thickness. A typical bath for copper deposition consists of a soluble copper salt, a complexing agent for cupric ions, an alkali or alkaline earth metal hydroxide, an active reducing agent such as formaldehyde, and a complexing agent for cuprous ions. Such components and the appropriate proportions are well known in the art.

The thickness of the deposited film is not critical and can be any amount which will provide an effective plasma barrier. A film thickness of at least about 200 angstroms is preferred, with about 200 to about 500 angstroms particularly preferred.

The exposed portions 8 of the insulating layer 2, as shown in FIG. 4, are then etched by conventional plasma etching techniques to achieve the structure shown in FIG. 5. Plasma etching techniques well known in the art are suitable. A typical system is the Davis and Wilder 425 Plasma Etcher, using a $CF_4/H_2$ reagent gas mixture at a proportion of 70:30, with an etch rate of about 1200 Angstroms per minute, a radio frequency current of about 6 amps, a pressure of about 360 millitorr, a total flow rate of about 500 cc per minute, and a radial distance of about 29 cm. When the insulating layer is an organic material, a reactive ion etcher such as the Applied Material 8100 system may be used, with oxygen as the reagent gas, at a pressure of about 5 microtorr, a flow rate of about 20 to 40 cc per minute, and a radio frequency power of about 0.5 watts per square centimeter.

The electroless metal mask 7 operates as an effective barrier during the etching process, thus restricting the etching to the areas where exposure of the substrate for subsequent doping techniques is desired.

The foregoing description is offered solely for purposes of illustration. The invention is intended to be defined by the scope of the appended claims, rather than by the particular features of construction and operation shown or described above. Numerous modifications and variations not mentioned above but still falling within the spirit and scope of the invention will be readily apparent to those skilled in the art.

What is claimed is:

1. A method of selectively removing portions of an etchable layer on a substrate according to a predetermined pattern, which method comprises:
    (a) applying to said layer a first mask which is positive with respect to said pattern,
    (b) adhesively binding to said masked layer an agent catalytic to the reception of electroless metal deposition,
    (c) immersing said substrate in an electroless metal depositing bath and removing said first mask to form a second mask of electrolessly deposited metal, which second mask is negative with respect to said pattern, and
    (d) forming by plasma etching openings in said layer in the unmasked areas thereof.

2. A method according to claim 1 in which said electrolessly deposited metal of step (c) is copper.

3. A method according to claim 1 in which the catalytic agent of step (b) is palladium.

4. A method according to claim 1 in which step (b) is achieved by first contacting said layer with an aqueous solution of a sensitizing agent selected from $SnCl_2$, $TiCl_3$, and $PbCl_2$, and then contacting said layer with an aqueous solution of an activating agent selected from $Pdcl_2$, $PtCl_2$, and $RhCl_3$.

5. A method according to claim 1 in which step (b) is achieved by first contacting said layer with an aqueous solution of $SnCl_2$, and then contacting said layer with an aqueous solution of $PdCl_2$.

6. A method according to claim 1 in which step (c) is performed by first removing said mask, and then immersing said substrate in said electroless metal depositing bath.

7. A method according to claim 1 in which step (c) is performed by first immersing said substrate in said electroless metal depositing bath, and then removing said mask.

8. A process according to claim 1 in which the thickness of said electrolessly deposited metal in step (c) is at least about 200 angstroms.

9. A method for selectively opening areas of a layer of insulating material overlying a semiconductor substrate according to a predetermined pattern, which method comprises:
    (a) applying to said layer a mask which is positive with respect to said pattern, (b) adhesively binding to said masked layer a film of metallic palladium sufficient to promote the reception of electroless copper deposition, (c) immersing said substrate in an electroless copper depositing bath to deposit thereon a layer of metallic copper of a thickness of at least about 200 angstroms, (d) removing said mask to expose the areas thereunder of said insulating material layer, and (e) forming by plasma etching openings in said insulating material layer at said exposed areas.

10. A method for selectively opening areas of a layer of insulating material overlying a semiconductor substrate according to a predetermined pattern, which method comprises:

(a) applying to said layer a mask which is positive with respect to said pattern, (b) adhesively binding to said masked layer a film of metallic palladium sufficient to promote the reception of electroless copper deposition, (c) removing said mask to expose the areas thereunder of said insulating material layer, (d) immersing said substrate in an electroless copper depositing bath to deposit thereon a layer of metallic copper of a thickness of at least about 200 angstroms, and (e) forming by plasma etching openings in said insulating material layer at said exposed areas.

* * * * *